US010072350B2

(12) United States Patent
Garandet et al.

(10) Patent No.: US 10,072,350 B2
(45) Date of Patent: Sep. 11, 2018

(54) METHOD FOR MANUFACTURING A SILICON INGOT HAVING UNIFORM PHOSPHORUS CONCENTRATION

(71) Applicant: COMMISSARIAT A L'ENERGIE ATOMIQUE ET AUX ENERGIES ALTERNATIVES, Paris (FR)

(72) Inventors: Jean-Paul Garandet, Le Bourget du Lac (FR); Malek Benmansour, La Motte Servolex (FR); Anis Jouini, Chambery (FR); David Pelletier, La Ravoire (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 363 days.

(21) Appl. No.: 15/022,707

(22) PCT Filed: Sep. 16, 2014

(86) PCT No.: PCT/IB2014/064555
§ 371 (c)(1),
(2) Date: Mar. 17, 2016

(87) PCT Pub. No.: WO2015/040542
PCT Pub. Date: Mar. 26, 2015

(65) Prior Publication Data
US 2016/0230306 A1 Aug. 11, 2016

(30) Foreign Application Priority Data
Sep. 17, 2013 (FR) ...................... 13 58935

(51) Int. Cl.
C30B 11/00 (2006.01)
C30B 29/06 (2006.01)

(52) U.S. Cl.
CPC ............ *C30B 11/006* (2013.01); *C30B 11/00* (2013.01); *C30B 29/06* (2013.01)

(58) Field of Classification Search
None
See application file for complete search history.

(56) References Cited

U.S. PATENT DOCUMENTS

2010/0171232 A1* 7/2010 Servant .................. C30B 11/04
264/104
2012/0279437 A1 11/2012 Johnson
(Continued)

FOREIGN PATENT DOCUMENTS

CN 102586862 A 7/2012
FR 2 968 127 A1 6/2012
(Continued)

OTHER PUBLICATIONS

Dhamrin et al., "Realization of High Minority-Carrier Properties in Low-Resistivity N-Type Multicrystalline Silicon," 22nd European Photovoltaic Solar Energy Conference, Sep. 3-7, 2007, pp. 1151-1154, Milan, Italy.
(Continued)

Primary Examiner — John J Figueroa
(74) Attorney, Agent, or Firm — Oliff PLC

(57) ABSTRACT

A method for manufacturing a silicon ingot having uniform phosphorus concentration. The method includes at least the steps of: (i) providing a quasi-uniform molten silicon bath containing at least phosphorus; and (ii) proceeding to the directional solidification of the silicon, wherein a speed (VI) for solidifying the silicon and a rate (JLV) of evaporation of the phosphorus at the liquid/vapor interface of the bath are controlled such that, at each moment of the directional solidification, the following equation is verified: VI=k'/(2−k) (E), wherein k' is the phosphorus transfer coefficient, and k is the distribution coefficient of the phosphorus in the
(Continued)

Figure 1:
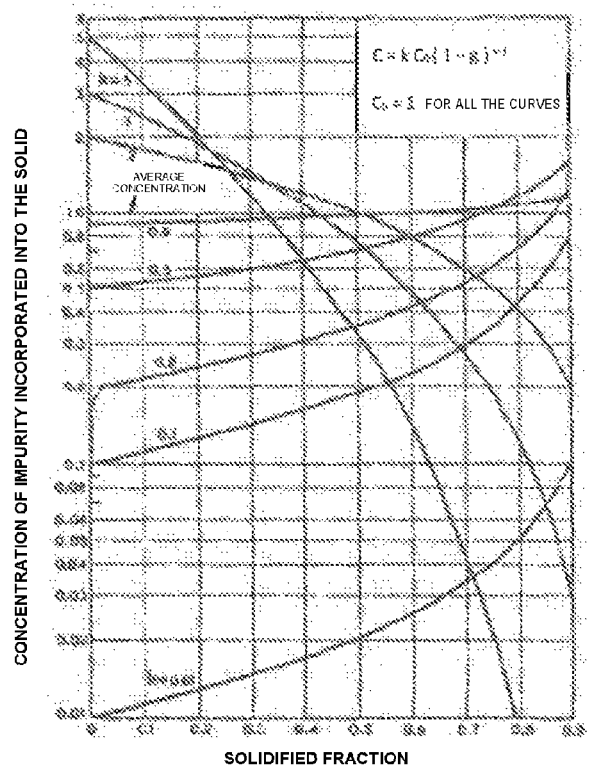

silicon. Also relates to a silicon ingot having uniform phosphorus concentration across a height of at least 20 cm.

22 Claims, 1 Drawing Sheet

(56) References Cited

U.S. PATENT DOCUMENTS

2013/0239370 A1    9/2013  Pihan et al.
2015/0069213 A1*   3/2015  Carberry ............... H01L 31/18
                                                      249/114.1

FOREIGN PATENT DOCUMENTS

WO    2008/0131794 A1    11/2008
WO     2013/051940 A1     4/2013

OTHER PUBLICATIONS

Zheng et al., "Mass Transfer of Phosphorus in Silicon Melts Under Vacuum Induction Refining," Metallurgical and Materials Transactions, Dec. 2010, vol. 41B, pp. 1268-1273.
Jan. 28, 2015 International Search Report issued in International Patent Application No. PCT/IB2014/064555.
Jan. 28, 2015 Written Opinion issued in International Patent Application No. PCT/IB2014/064555.
Oct. 26, 2017 Office Action issued in Chinese Application No. 201480051385.2.

* cited by examiner

METHOD FOR MANUFACTURING A SILICON INGOT HAVING UNIFORM PHOSPHORUS CONCENTRATION

The present invention relates to a novel process for manufacturing a silicon ingot having a uniform phosphorus distribution.

Such an ingot is particularly advantageous in the context of the production of photovoltaic cells.

Currently, photovoltaic cells are predominantly fabricated from monocrystalline or polycrystalline silicon. The most common path for producing crystalline silicon involves the solidification of ingots from a bath of liquid silicon contained in a crucible. These ingots are then cut into wafers which may then be converted into photovoltaic cells.

The silicon feedstock, used as starting material for the formation of the silicon ingots, is conventionally produced by means of a process of distillation of a chlorinated precursor, for example trichlorosilane, obtained from a metallurgical grade silicon. This process allows effective purification of the silicon, but unfortunately proves to be expensive in terms of financial investment and energy consumption.

Various routes have been explored for manufacturing a solar grade silicon feedstock using processes which come from metallurgy, and which are less expensive than the gaseous routes.

In this respect, directional solidification processes are well known for allowing segregation of the impurities, and therefore purification of the starting feedstocks.

For purifying silicon, the directional solidification technique is particularly suitable for removing metal impurities, such as iron, chromium, nickel, etc., the partition coefficients of which, denoted k (defined as the ratio between the concentration of impurity in the solid phase and the concentration in the liquid phase at the solidification interface), are very small compared to unity. A low partition coefficient for a given impurity thus makes it possible to envision a very effective purification of the silicon by segregation of said impurity. In order to obtain optimal segregation, it is, moreover, known that the molten bath must be as uniform as possible.

In the optimal case of a uniform molten bath, the segregation of an impurity may be given by Scheil's law ($C(x)=k \cdot C_0 \cdot (1-x)^{k-1}$, with $C_0$ the concentration of the impurity under consideration in the molten bath before the beginning of crystallization), which links the concentration $C(x)$ of said impurity in the solid formed, and the solidified fraction x, via the partition coefficient k of said impurity.

The variations in the concentration of impurity incorporated into the solid as a function of the solidified fraction are represented in FIG. 1 for various partition coefficient values. It emerges from the curves represented in FIG. 1 that the concentration of impurity incorporated into the solid is capable of varying considerably during the solidification of the silicon, depending on the partition coefficient of the impurity under consideration.

Such concentration profiles are capable of posing a problem for ensuring uniform resistivity of the silicon ingots intended for photovoltaic use. Indeed, in these silicon ingots, the contents of p-type and n-type doping agents (elements of columns III and V of the periodic table of elements), in practice of phosphorus and of boron, govern the resistivity of the silicon.

With regard to boron, since its partition coefficient is 0.8, and therefore close to unity, the variations in concentration of boron incorporated into the solidified silicon between the bottom and the top of the ingot remain acceptable.

On the other hand, phosphorus has a very low partition coefficient, of approximately 0.35, which induces sizeable variations in phosphorus concentration in the solidified silicon, and therefore resistivity variations which are highly prejudicial to the production of photovoltaic cells from these silicon ingots. The partition coefficient of phosphorus is, moreover, too high to allow effective purification by directed solidification of metallurgical silicon feedstocks, which generally have phosphorus contents above 10 parts per million (ppm) by weight, and are therefore entirely unsuitable for producing photovoltaic cells.

Alternative processes for eliminating phosphorus have been proposed, in particular by evaporation under vacuum at high temperature [2]. However, unless the purified liquid is tempered, which is not acceptable from the point of view of the crystalline quality of the solid silicon required for photovoltaic applications, the phosphorus concentration cannot be kept constant in the solidified silicon, owing to the segregation mechanisms mentioned above.

Thus, the control of phosphorus concentrations in silicon ingots remains problematic. This problem arises particularly in the case of silicon feedstocks termed compensated, comprising both n-type and p-type doping agents, for which an absence of control of the phosphorus concentration may result in a change in the type of conductivity of the crystalline silicon during directed solidification, thus causing the exploitable part of the ingot, and therefore the material yield of the process, to significantly drop.

Consequently, there remains a need to have an inexpensive method for producing a silicon ingot, which makes it possible to provide a uniform phosphorus concentration, and consequently a uniform resistivity, in the ingot formed.

The present invention aims precisely to meet this need.

Thus, according to a first of these aspects, it relates to a process for manufacturing a silicon ingot having a uniform phosphorus concentration, comprising at least the steps consisting in:

(i) providing an almost uniform bath of molten silicon comprising at least phosphorus; and (ii) carrying out the directional solidification of the silicon, with a speed of solidification ($V_I$) of the silicon and a rate of evaporation ($J_{LV}$) of the phosphorus at the liquid-vapor interface of the bath which are controlled such that, at each moment of the directional solidification, the following equation is verified:

$$V_I = k'/(2-k) \quad (E)$$

k' representing the phosphorus transfer coefficient, and k representing the partition coefficient of the phosphorus in the silicon.

The inventors have thus discovered that it is possible to provide a uniform phosphorus content in a silicon ingot produced by a conventional process of directional solidification, via simultaneous control of the heat extraction and phosphorus evaporation kinetics.

According to another of these aspects, the present invention relates to a silicon ingot having a uniform phosphorus concentration across a height of at least 20 cm, or even across its entire height.

The term "uniform" phosphorus distribution or concentration is intended to characterize the fact that the relative variations in the phosphorus concentration in the solid silicon are less than or equal to 20%, preferably less than or equal to 10%, and more preferentially less than or equal to 4%.

The present invention also relates to a silicon ingot capable of being obtained by means of the process previously defined.

As detailed in the remainder of the text, a phosphorus partial evaporation pretreatment may be carried out in order to reduce the phosphorus content of the molten silicon bath, before initiating the solidification, thereby making it possible to bring the phosphorus content in the final silicon ingot to a value compatible with photovoltaic use.

Advantageously, the process of the invention thus makes it possible to produce a silicon ingot, which has a controlled concentration of phosphorus uniformly distributed within the ingot, particularly suitable for being cut into wafers intended to directly enter a process for producing photovoltaic cells.

The process of the invention may also be implemented to produce a silicon feedstock having a uniform phosphorus concentration, intended to be remelted, for example in a recrystallization process.

Moreover, the process of the invention advantageously allows the use of high solidification speeds, and therefore makes it possible to achieve productivities satisfactory for an industrial-scale application.

Other characteristics, advantages and modes of application of the process according to the invention will emerge more clearly on reading the description, the example and the figures which follow, given by way of nonlimiting illustration.

In the remainder of the text, the expressions "of between . . . and . . . ", "ranging from . . . to . . . " and "varying from to . . . " are equivalent and are intended to signify that the limits are included, unless otherwise mentioned.

Unless otherwise mentioned, the expression "containing/comprising a" should be understood as "containing/comprising at least one".

Manufacture of the Silicon Ingot

Step (i): Molten Silicon Bath

As previously specified, step (i) of the process of the invention consists in providing an almost uniform bath of molten silicon, also denoted "liquid" bath, comprising at least phosphorus (P).

The term "almost uniform" bath is intended to characterize the fact that the maximum difference in phosphorus concentration in the liquid silicon bath is less than or equal to 20%, preferably less than or equal to 15%, and more preferentially less than or equal to 10%.

According to one particular embodiment, the molten bath may also comprise at least one p-type doping agent, in particular boron.

The preparation of the molten silicon bath used in step (i) of the process of the invention is part of the general knowledge of those skilled in the art.

In one preferential embodiment, the silicon feedstock may consist of lumps of silicon or of metallurgical quality, extracted for example directly from silica reduction furnaces, or else prepurified by plasma treatment or refining.

In another embodiment, the molten bath may be formed beforehand by introducing into a crucible, in the solid phase, phosphorus-doped silicon wafers and, where appropriate, p-type doped silicon wafers, followed by heating of the whole mixture at a temperature above the melting point of silicon.

The bath of molten silicon may be produced in a crucible made of silica or of graphite (optionally covered with a layer of SiC). Crucibles are known for withstanding heating at high temperatures appropriate for obtaining the molten bath.

The molten bath used in step (i) may comprise a phosphorus concentration of less than or equal to 50 ppm, in particular less than or equal to 25 ppm, especially less than or equal to 5 ppm, and more particularly of between 0.3 and 3 ppm.

According to one implementation variant, the bath of molten silicon may be subjected, prior to its use in step (i) of the process of the invention, to a heat treatment conducive to the partial evaporation of the phosphorus from the initial feedstock. This pretreatment advantageously makes it possible to reduce the phosphorus content of the molten bath, with a view to obtaining a phosphorus concentration in the final ingot that is compatible with photovoltaic use.

Those skilled in the art are able to implement a heat treatment appropriate for the partial evaporation of the phosphorus, for example by subjecting, for a predetermined period of time, the initial molten silicon feedstock to a temperature gradient, at temperatures and pressure adjusted to promote the evaporation of the phosphorus, as illustrated in the example which follows.

Of course, it is up to those skilled in the art to adjust the volume of the bath of molten silicon used in step (i) of the process of the invention, from the viewpoint of the dimensions of the desired silicon ingot.

The bath of molten silicon may be stirred, prior to its use in step (ii) and/or during the directional solidification in step (ii) detailed below, using a stirring system, so as to ensure good uniformity of the bath, in particular a uniform dispersion of the phosphorus in the bath of molten silicon.

The stirring system may consist, for example, of magnetic stirring, stirring by means of a vibrating table, stirring by ultrasound or by mechanical paddles, etc.

Step (ii): Directional Solidification of the Silicon

In a second step of the process of the invention, directional solidification of the silicon is carried out, by simultaneously controlling the speed of solidification, denoted $V_I$, of the silicon and the rate of evaporation, denoted $J_{LV}$, of the phosphorus at the liquid-vapor interface of the bath, such that, at each moment of the directional solidification, the following equation is verified:

$$V_I = k'/(2-k) \tag{E}$$

k' representing the phosphorus transfer coefficient, and
k representing the partition coefficient of the phosphorus in the silicon.

Figure 2:
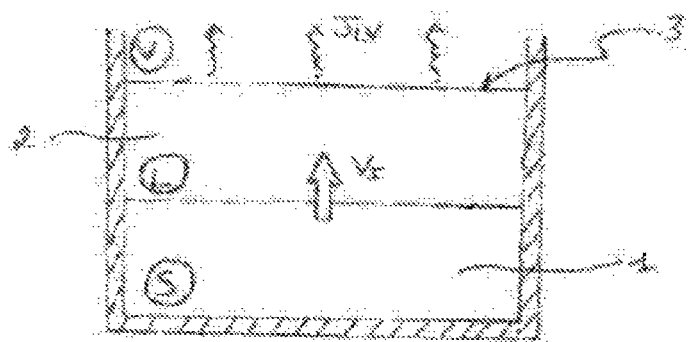

The two parameters, $V_I$ and $J_{LV}$, to be controlled during the directional solidification of the silicon in the process of the invention are represented, diagrammatically, in FIG. 2.

Generally, directional solidification methods make use either of a drawing process, for example using the Czochralski drawing method or else the "Bridgman" method, or of a process by gradual cooling of the liquid bath, contained in a container, in particular a crucible, below its melting point, starting from one of its ends, until solidification is obtained.

Preferably, the directional solidification in step (ii) is carried out by means of a gradient freeze method.

It is within the general knowledge of those skilled in the art to use equipment suitable for the directional solidification method chosen.

Generally, in the "gradient freeze" technique, the ingots are crystallized in a directional solidification furnace inside which the cooling is controlled by decreasing the power delivered to the liquid phase or increasing the power removed from the solid ingot. The shifting of the solid (1)/liquid (2) interface in the crucible comes from the modulation of the heat delivered and of the heat extracted in the various parts of the crucible.

Those skilled in the art are able to control and adjust the values of the speed of solidification $V_I$ of the silicon and of the rate of evaporation $J_{LV}$ of the phosphorus at the liquid-vapor interface (3) of the bath, so as to satisfy the abovementioned equation (E), and thus to provide constant incorporation of the phosphorus within the silicon solidified (1) during the directed solidification.

According to a first implementation variant of the invention, the rate of evaporation of the phosphorus $J_{LV}$ is kept constant during the directional solidification in step (ii), the speed of solidification of the silicon $V_I$ being adjusted appropriately during the directional solidification so as to satisfy the abovementioned equation (E) and thus to guarantee a uniform distribution of the phosphorus within the solidified silicon.

According to a second implementation variant of the invention, the directional solidification in step (ii) is carried out at a constant silicon solidification speed, the phosphorus evaporation rate $J_{LV}$ being adjusted appropriately during the directional solidification so as to satisfy the abovementioned equation (E) and thus to guarantee uniform distribution of the phosphorus within the solidified silicon.

According to one particular embodiment, the phosphorus evaporation rate $J_{LV}$ in step (ii) may be controlled via an adjustment of the phosphorus transfer coefficient k'.

Without wishing to be bound by theory, the phosphorus evaporation rate $J_{LV}$ (expressed in moles per unit of surface area and of time) may be linked to the phosphorus transfer coefficient, k', also called "evaporation constant" (expressed in m/s), by the relationship: $J_{LV}=k'\times C$, with C being the phosphorus concentration in the liquid bath at the liquid-vapor interface (3). The transfer coefficient k' depends in particular on the temperature of the liquid-vapor interface (3) of the molten bath, and on the pressure in the chamber of the directional solidification furnace used.

Thus, the phosphorus evaporation rate $J_{LV}$ (and the phosphorus transfer coefficient k') may be controlled by adjusting the temperature of the liquid-vapor interface of the molten bath and/or the pressure in the chamber of the directional solidification furnace.

By way of example, the phosphorus transfer coefficient k' in step (ii) may be between $1.5\times10^{-6}$ and $3\times10^{-5}$ m/s, in particular between $8\times10^{-6}$ and $1.5\times10^{-5}$ m/s.

With regard to the silicon solidification speed $V_I$, it may be controlled via an adjustment of the heat flow in the directional solidification furnace used, in particular by controlled extraction of the heat.

By way of example, the average silicon solidification speed $V_I$ in step (ii) may be between 1 and 20 µm/s, in particular between 5 and 10 µm/s.

Likewise, it is within the general knowledge of those skilled in the art to appropriately adjust the operating means and conditions of the directional solidification furnace used, so as to modulate the heat flow during the directional solidification in step (ii).

Various means of heating (for example resistive or inductive) or of extracting the heat may be used. By way of example, the heat flow in the directional solidification furnace may be modulated by controlled extraction of heat by the bottom of the crucible, for example using a heat exchanger with adjustable thermal conductivity, as proposed in document FR 2 968 127, or any other system known to those skilled in the art for allowing regulation of the heat flow extracted.

Preferably, the phosphorus is almost uniformly dispersed in the bath of molten silicon (2) during the directional solidification.

As previously mentioned, according to one particular embodiment, the molten bath may be kept stirring, using a stirring system, during the directional solidification, so as to ensure good uniformity of the bath of molten silicon.

As illustrated in example 1 which follows, the simultaneous control of the silicon solidification speed ($V_I$) and of the phosphorus evaporation rate ($J_{LV}$), so as to satisfy the equation $V_I=k'/(2-k)$ (E), makes it possible to achieve uniform phosphorus distribution in the solidified ingot.

Without wanting to be bound by theory, in order to obtain uniform phosphorus distribution within the solidified silicon, it is advisable to be sure, throughout the directed solidification, that dC/dt=0 (equation 1), with C representing the phosphorus concentration in a uniform molten bath.

Since the phosphorus concentration C in a uniform bath may be expressed in the form:

$$C=Q/(S\times h)$$

with Q the total amount of phosphorus in the bath, expressed in moles, S the cross section of the crucible containing the bath of molten silicon, and h the height of the bath which varies during the directed solidification, the abovementioned equation 1 may be expressed in the form:

$$dQ/dt\times h-Q\times dh/dt=0 \qquad \text{(equation 2)},$$

with $dh/dt=-V_I$, $V_I$ representing the silicon solidification speed.

Furthermore, if it is considered that, between t and t+dt of the directed solidification, the amount of phosphorus in the bath is increased by the phosphorus rejection mechanism at the solid-liquid interface, and simultaneously decreased via the phosphorus evaporation mechanism at the liquid-vapor interface, it may be considered that:

$$dQ/dt=[V_I\times(1-k)\times C-J_{LV}]\times S \qquad \text{(equation 3)}$$

with k the partition coefficient of the phosphorus in the silicon, close to 0.35, $J_{LV}$ the phosphorus evaporation rate at the liquid-vapor interface of the bath (expressed in moles per unit of surface area and of time).

When $J_{LV}$ is expressed in the form $J_{LV}=k'\times C$, with k' the phosphorus transfer coefficient (expressed in m/s), the abovementioned equation 2 is thus expressed by:

$$V_I=k'/(2-k) \qquad \text{(equation (E))}.$$

Thus, in the case of an almost uniform bath, it is possible to guarantee a uniform phosphorus distribution within the solidified silicon, by adjusting the silicon solidification speed $V_I$ and the phosphorus evaporation rate $J_{LV}$ (i.e. the phosphorus evaporation constant k'), such that, at each moment of the directional solidification, the abovementioned equation (E) is verified.

Other variants of application of the process of the invention, for example using a non-uniform silicon bath, may be envisioned, without departing from the spirit of the invention.

Of course, the silicon solidification speed ($V_I$) and the phosphorus evaporation rate ($J_{LV}$) will then be controlled, so as to guarantee uniform phosphorus distribution within the solidified silicon, according to control equations that are different depending on the characteristics of the bath of molten silicon and the conditions for carrying out the directed solidification.

Thus, generally, the present invention proposes to obtain a silicon ingot having a uniform phosphorus concentration, from a bath of molten silicon comprising at least phosphorus, by carrying out the directional solidification of the silicon, with a silicon solidification speed ($V_I$) and a phosphorus evaporation rate ($J_{LV}$) at the liquid-vapor interface of the bath which are controlled so as to guarantee uniform phosphorus distribution within the solidified silicon.

Silicon Ingot

As previously seen, the present invention relates, according to another of its aspects, to a silicon ingot having a uniform phosphorus concentration across a height of at least 20 cm, or even across its entire height.

Such an ingot may be more particularly obtained via the directional solidification process previously described.

The term "uniform" phosphorus concentration is intended more particularly to characterize the fact that the relative variations in the phosphorus concentration across the height of the silicon ingot under consideration are less than or equal to 20%, in particular less than or equal to 10%, and more preferentially less than or equal to 4%.

The distribution of the phosphorus within the silicon ingot may be evaluated by measurement of the resistivity variations. The resistivity may be measured by any conventional method known to those skilled in the art, for instance by "four-point" measurement, or else by measurement of the effect of the Foucault currents induced by an alternating magnetic field.

The phosphorus distribution within the solidified silicon may also be determined by the Glow Discharge Mass Spectroscopy (GDMS) technique.

According to one particularly preferred embodiment, the ingot has a uniform phosphorus content across its entire height.

Said silicon ingot may more particularly have a height of between 10 cm and 1 in, in particular of between 20 and 50 cm.

The height of the ingot is understood to mean the dimension of the ingot along the (z) axis of an orthogonal reference having axes (x), (y) and (z), the (z) axis being collinear with the direction of solidification of the silicon during the manufacture of the ingot.

The concentration of phosphorus, uniformly distributed within the silicon ingot, may in particular be less than or equal to 20 ppm, in particular less than or equal to 5 ppm and more particularly between 0.1 and 2 ppm.

After standard topping and tailing of the peripheral zones of the ingot, the latter may be cut into bricks according to techniques known to those skilled in the art. Silicon wafers may then be produced from these bricks, according to conventional techniques known to those skilled in the art, in particular by cutting up the bricks, rectifying the faces, topping and tailing the top and bottom ends, so as to adjust the dimensions of the wafer, etc.

As previously mentioned, these wafers, which have a uniform phosphorus content, and therefore a uniform resistivity, may advantageously be used directly for producing photovoltaic cells.

FIGURES

FIG. 1: Curves, established according to Scheil's law, of variation of the concentration of species incorporated into the solid as a function of the solidified fraction for various values of the partition coefficient k;

FIG. 2: Diagrammatic representation of the controlled parameters, silicon solidification speed $V_L$ and phosphorus evaporation rate $J_{LV}$, at a given moment of the directional solidification of the silicon according to the process of the invention.

The invention will now be described by means of the following example, given by way of nonlimiting illustration of the invention.

Example

A silicon feedstock of approximately 60 kg, in the form of lumps with centimetric dimensions, is introduced into a graphite crucible coated with a layer of Si carbide, having interior dimensions of 39×39×39 cm, onto which a release coating of silicon nitride had previously been deposited. The phosphorus content of the feedstock is 15 ppm weight, measured by the Glow Discharge Mass Spectroscopy technique.

The whole is then introduced into the solidification device, a "gradient freeze" technology vertical furnace, with heating elements (graphite resistors) located in the top part and on the sides of the crucible.

Reduction of the Phosphorus Concentration

The silicon is first subjected to a temperature increase in order to ensure complete melting thereof, and a gradient of 10 K/cm is applied across the height of the bath, the top of which is kept at a temperature of 1650° C. and the bottom of which at a temperature close to 1410° C. for approximately three hours at a pressure of 5×10$^{-3}$ mbar in order to promote evaporation of the phosphorus and to bring the phosphorus concentration of the bath back to a value of 2 ppm weight.

Directional Solidification of the Silicon

The temperature in the hot part (temperature of the liquid-vapor interface) is kept equal to 1650° C. throughout the solidification; the phosphorus transfer coefficient k' is thus kept constant during the directional solidification.

The natural convection in the molten bath is sufficient for it to be possible for said bath to be considered an almost uniform bath.

The silicon solidification speed is adjusted so as to satisfy the equation $V_f = k'/(2-k)$ (E), with k the partition coefficient of the phosphorus in the silicon, of approximately 0.35.

The growth of the silicon is initiated by opening insulating shutters. The gradual opening of the insulating shutters makes it possible to control the heat to be evacuated throughout the process.

Complete solidification of the liquid bath 22 cm in height is carried out in approximately 10 hours, the average solidification speed is therefore 2.2 cm/h (6 μm/s). In the growth regime, the power consumed by the furnace is approximately 38 kW. The heating power is then reduced and the ingot is brought back to ambient temperature and demolded from the crucible.

Result

An analysis of the variations in resistivity within the silicon ingot, by "4-point" measurement, makes it possible to verify that the phosphorus is uniformly distributed in the ingot.

REFERENCES

[1] W. G. Pfann, "*Zone melting*" (2$^{nd}$ edition), Wiley, New York 1966;
[2] S. S Zheng et al., "*Mass Transfer of Phosphorus in Silicon Melts Under Vacuum Induction Refining*", Metall. Mat. Trans. B, 41B (2010) 1268-1273.

The invention claimed is:

1. A process for manufacturing a silicon ingot having a uniform phosphorus concentration, comprising at least the steps consisting in:

(i) providing an almost uniform bath of molten silicon comprising at least phosphorus; and
(ii) carrying out the directional solidification of the silicon, with a speed of solidification ($V_I$) of the silicon and a rate of evaporation ($J_{LV}$) of the phosphorus at the liquid-vapor interface of the bath which are controlled such that, at each moment of the directional solidification, the following equation is verified:

$$V_I = k'/(2-k) \quad (E)$$

k' representing the phosphorus transfer coefficient, and
k representing the partition coefficient of the phosphorus in the silicon.

2. The process as claimed in claim 1, wherein the silicon bath undergoes, prior to its use in step (i), a heat treatment conducive to the partial evaporation of the phosphorus.

3. The process as claimed in claim 1, wherein the phosphorus is present in the molten bath in step (i) in a concentration of less than or equal to 50 ppm.

4. The process as claimed in claim 1, wherein the phosphorus is present in the molten bath in step (i) in a concentration of less than or equal to 25 ppm.

5. The process as claimed in claim 1, wherein the phosphorus is present in the molten bath in step (i) in a concentration of less than or equal to 5 ppm.

6. The process as claimed in claim 1, wherein the phosphorus is present in the molten bath in step (i) in a concentration of between 0.3 and 3 ppm.

7. The process as claimed in claim 1, wherein the molten bath is stirred, prior to its use in step (ii) and/or during the solidification in step (ii), using a stirring system, so as to ensure almost uniform dispersion of the phosphorus in the bath of molten silicon.

8. The process as claimed in claim 1, wherein the silicon solidification step (ii) is carried out by means of a gradient freeze method.

9. The process as claimed in claim 1 wherein the phosphorus evaporation rate ($J_{LV}$) in step (ii) is controlled via an adjustment of the phosphorus transfer coefficient (k').

10. The process as claimed in claim 9, wherein the phosphorus evaporation rate ($J_{LV}$) in step (ii) is controlled by adjusting the temperature of the liquid-vapor interface of the molten bath and/or the pressure in the chamber of the directional solidification furnace used.

11. The process as claimed in claim 1, wherein the silicon solidification speed ($V_I$) in step (ii) is controlled via an adjustment of the heat flow in the directional solidification furnace used.

12. The process as claimed in claim 11, wherein the silicon solidification speed ($V_I$) in step (ii) is controlled by controlled extraction of the heat.

13. The process as claimed in claim 1, wherein the average silicon solidification speed ($V_I$) in step (ii) is between 1 and 20 μm/s.

14. The process as claimed in claim 1, wherein the average silicon solidification speed ($V_I$) in step (ii) is between 5 and 10 μm/s.

15. The process as claimed in claim 1, wherein the phosphorus transfer coefficient k' in step (ii) is between $1.5 \times 10^{-6}$ and $3 \times 10^{-5}$.

16. The process as claimed in claim 1, wherein the phosphorus transfer coefficient k' in step (ii) is between $8 \times 10^{-6}$ and $1.5 \times 10^{-5}$ m/s.

17. The process as claimed in claim 1, wherein the phosphorus evaporation rate ($J_{LV}$) is kept constant during the directional solidification in step (ii), the silicon solidification speed ($V_I$) being adjusted so as to satisfy the equation (E).

18. A silicon ingot having a uniform phosphorus concentration across a height of at least 20 cm.

19. The ingot as claimed in claim 18, said phosphorus concentration being less than or equal to 20 ppm.

20. The ingot as claimed in claim 19, said phosphorus concentration being less than or equal to 5 ppm.

21. The ingot as claimed in claim 18, having a uniform phosphorus concentration across its entire height.

22. The ingot as claimed in claim 21, said ingot having a height of between 10 cm and 1 m.

* * * * *